(12) United States Patent
Pautsch et al.

(10) Patent No.: US 6,345,515 B1
(45) Date of Patent: Feb. 12, 2002

(54) CONDITIONING AND FILLING SYSTEM FOR A SPRAY EVAPORATIVE COOLING WORKING FLUID

(75) Inventors: Gregory W. Pautsch, Chippewa Falls; William J. Matthews, Cornell; Rich Rineck, Chippewa Falls, all of WI (US)

(73) Assignee: Silicon Graphics, Inc., Mountain View, CA (US)

( * ) Notice: Subject to any disclaimer, the term of this patent is extended or adjusted under 35 U.S.C. 154(b) by 0 days.

(21) Appl. No.: 09/642,957

(22) Filed: Aug. 21, 2000

(51) Int. Cl.[7] .............................. F28D 5/00; F28D 3/02
(52) U.S. Cl. .............................. 62/311; 62/310; 62/318
(58) Field of Search .......................... 62/304, 310, 311, 62/171, 318

(56) References Cited

U.S. PATENT DOCUMENTS

| | | | | |
|---|---|---|---|---|
| 4,080,247 A | * | 3/1978 | Malakul | 159/17 R |
| 4,306,967 A | * | 12/1981 | Trautwein | 210/167 |
| 4,956,936 A | * | 9/1990 | Sprung | 47/17 |
| 5,131,233 A | * | 7/1992 | Cray et al. | 62/64 |
| 5,942,121 A | * | 8/1999 | Pantich | 210/664 |
| 6,060,966 A | * | 5/2000 | Tennant et al. | 333/202 |
| 6,102,113 A | * | 8/2000 | Cowans | 165/206 |

* cited by examiner

Primary Examiner—William C. Doerrler
(74) Attorney, Agent, or Firm—Schwegman, Lundberg, Woessner & Kluth, P.A.

(57) ABSTRACT

A conditioning and filling system includes a first processing section for degassing and dehydrating a working fluid, a second processing section for filtering the working fluid, and a monitoring section for sensing a condition of the working fluid, the monitoring section controlling a flow of the working fluid depending on the condition of the working fluid.

16 Claims, 5 Drawing Sheets

CONDITIONING AND FILLING SYSTEM FOR A SPRAY EVAPORATIVE COOLING WORKING FLUID

FIELD OF THE INVENTION

The present invention is related to system cooling, and more particularly to a conditioning and filling system for a spray evaporative cooling working fluid.

BACKGROUND

Modem electronics systems generate a great deal of heat in a very small space and must be cooled in order to dissipate the heat. Systems to date have used a variety of liquid and air cooling techniques to draw heat away from the electronic system. However, modem high-density electronics systems tend to pack devices in smaller and smaller spaces, increasing the heat generated per unit volume. Failure to remove adequate amounts of heat can result in overheating, leading to system error or failure.

One method of removing heat from an electronic system is spray evaporative cooling. Spray evaporative cooling works by generating a fine mist of droplets which form a thin layer of fluid on the components to be cooled. The fluid begins to heat up once in contact with the component. When the fluid reaches its boiling point, the molecules of liquid turn into a gas and "boil off" the component, thereby transferring the heat. The thin layer of fluid is replenished with a fine spray as the fluid evaporates.

However, the success of spray evaporative cooling is dependent in part on the condition of the working fluid. Particulates, water, gases, and other foreign matter can contaminate the working fluid and decrease its effectiveness. Such foreign matter can enter the working fluid while the fluid is being manufactured, when it is being transferred from a storage container into the system being cooled, or during operation of the system. A contaminated working fluid lowers the efficiency of the cooling system, which can lead to short life and unreliability of the electronic components being cooled.

SUMMARY

To address these and other needs, systems and methods have been devised for conditioning the working fluid of a spray evaporative cooling system and for filling the treated fluid into a system. An exemplary conditioning system includes a first processing section for degassing and dehydrating a working fluid, a second processing section for filtering the working fluid, and a monitoring section for sensing a condition of the working fluid, a flow of the working fluid depending on the condition of the working fluid.

An exemplary method of conditioning an evaporative spray cooling working fluid includes heating the working fluid to a vaporized state, condensing the working fluid to a liquid state from the vaporized state, and filtering the working fluid.

Another aspect provides an exemplary method of conditioning a perfluorinated liquid. One exemplary method includes heating the perfluorinated liquid to a vaporized state, condensing the vaporized perfluorinated liquid, filtering the perfluorinated liquid through a perfluoroisobutylene (PFIB) filter, a gas/moisture filter, and a particulate filter, monitoring a condition of the perfluorinated liquid, and repeatedly filtering the perfluorinated liquid through the PFIB filter, the gas/moisture filter, and the particulate filter until the perfluorinated liquid reaches a predetermined condition.

DETAILED DESCRIPTION

In the following detailed description, reference is made to the accompanying drawings that form a part hereof, and in which are shown by way of illustration specific embodiments in which the invention may be practiced. It is understood that other embodiments may be utilized and structural changes may be made without departing from the scope of the present invention.

Description of an Exemplary System

Figure 1:
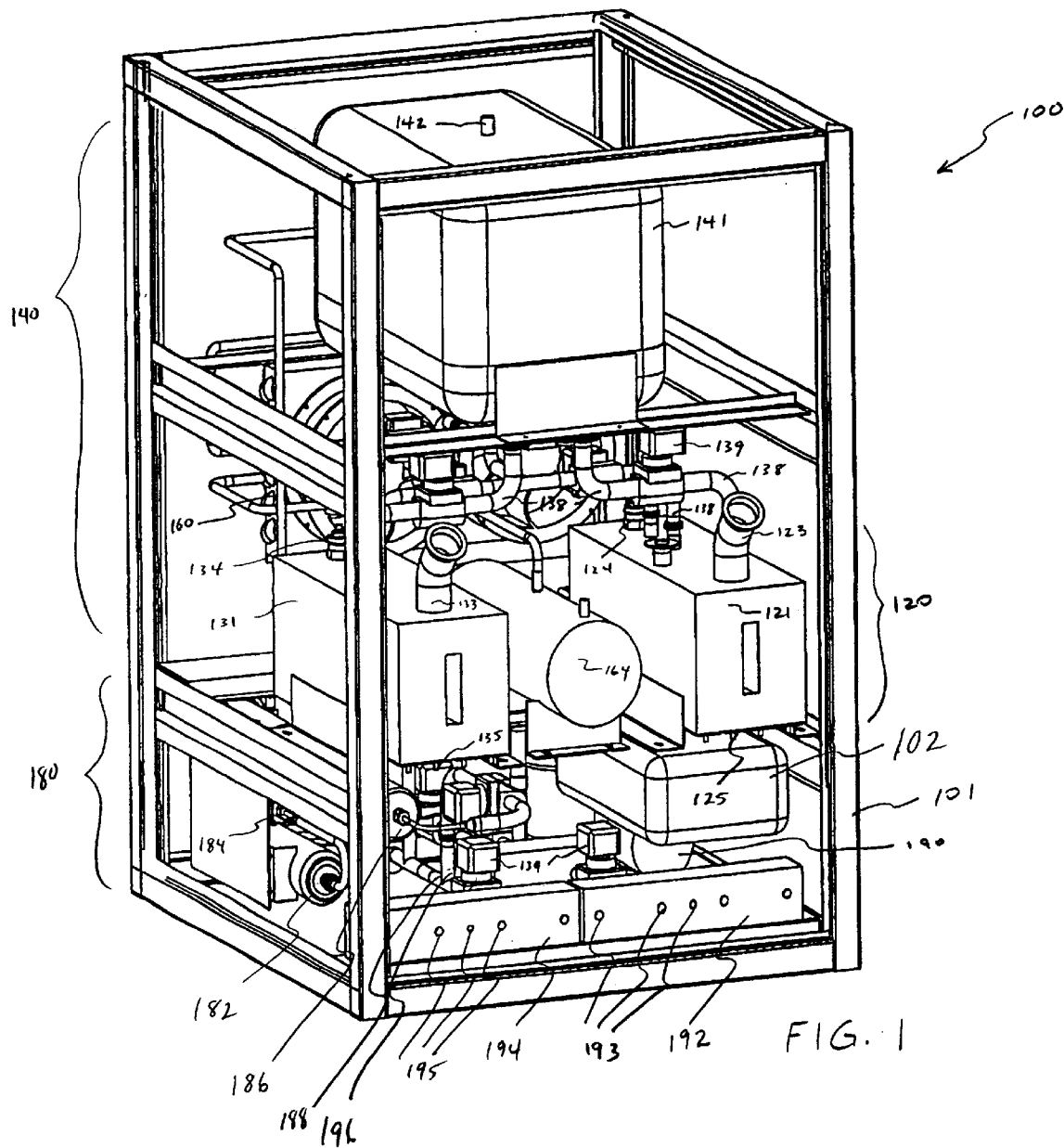
FIG. 1 is a front isometric view of an exemplary conditioning system in accord with one embodiment of the present invention.
Figure 2:
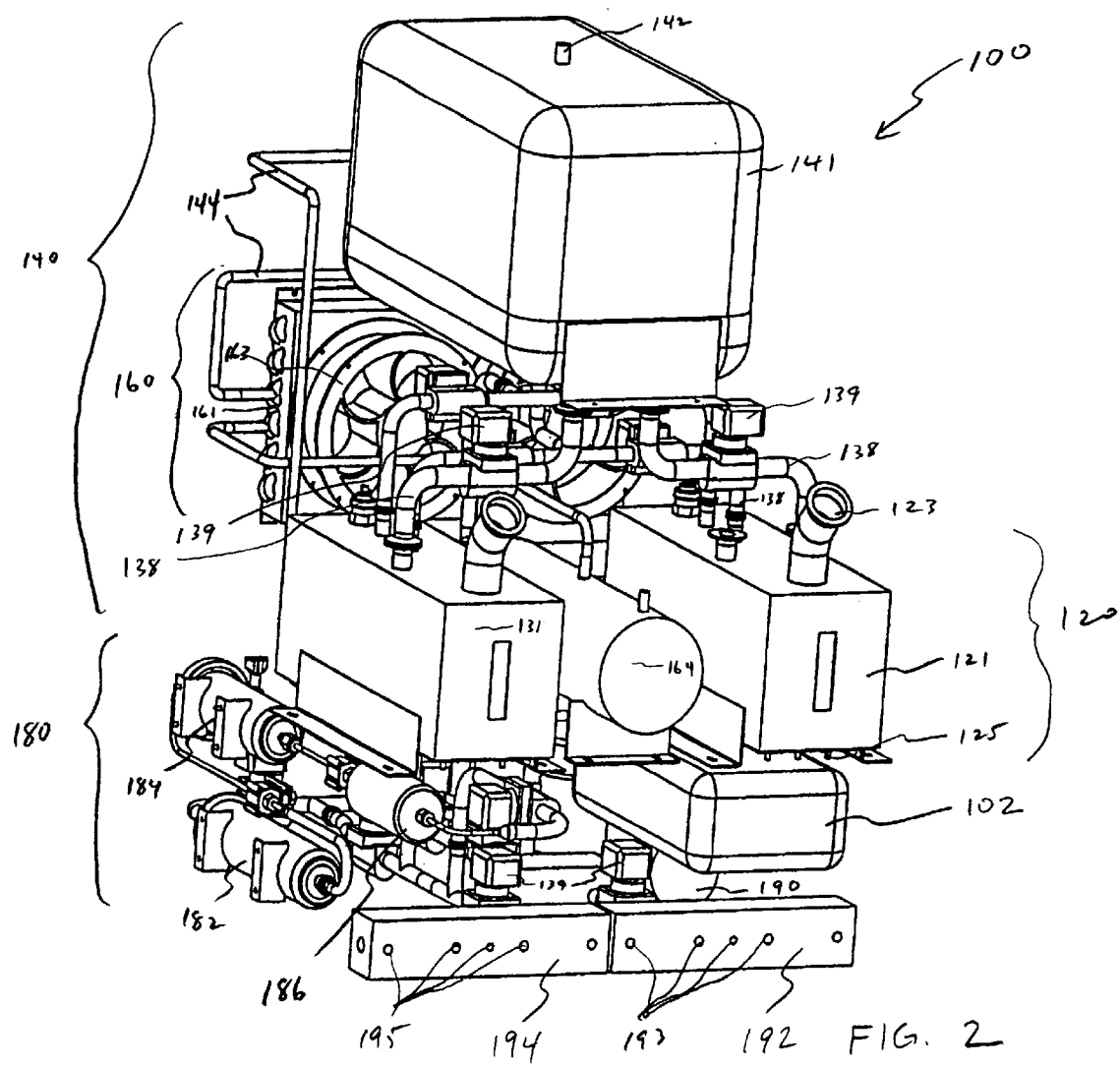
FIG. 2 is a front isometric view of the system of FIG. 1 with some details removed.
Figure 3:
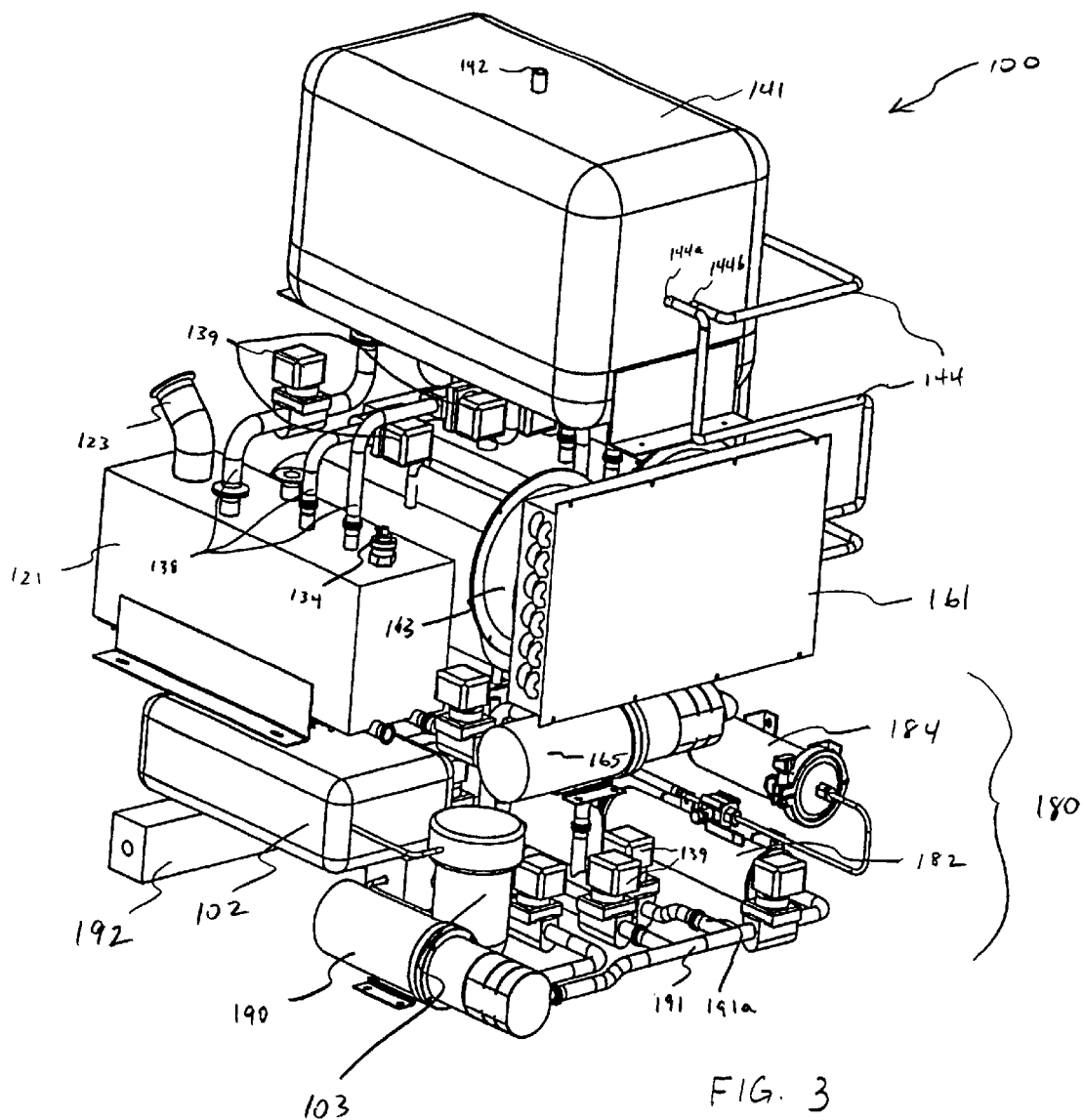
FIG. 3 is a rear isometric view of the system of FIG. 1.

FIGS. 1–3 show an exemplary conditioning system 100 according to one embodiment of the present invention. FIGS. 1 and 2 show front isometric views of system 100. FIG. 2 shows generally the same view as FIG. 1 with frame 101 removed to show further details of system 100. FIG. 3 shows a rear isometric view of system 100 and also does not show frame 101.

In one embodiment, conditioning system 100 is for treating or conditioning a spray evaporative cooling working fluid and inputting the conditioned fluid into a heat producing system, such as an electrical system like a supercomputer. System 100 helps to improve spray evaporative cooling techniques since it provides, among other advantages, a working fluid that is clean, dry, and free of organic materials. This helps insure the long-term life and reliability of electronic components or other heat producing components being cooled by the spray evaporative cooling system. For instance, in one embodiment, system 100 can be used to condition a working fluid for a spray evaporative cooling system for a computer system. Having clean fluid prevents the spray nozzles from plugging up and also prevents the electronic components from acquiring a film thereupon which can hinder further cooling.

One exemplary spray evaporative working fluid which can be conditioned by system 100 is a perfluorinated liquid such as Fluorinert™ electronic liquid (FC72), which is manufactured by 3M. FC72 is an inert, fully fluorinated (perfluorinated) hydrocarbon (non-CFC) fluid which is a liquid at room temperature but boils at 59° C. Other embodiments treat or condition other working fluids, such as other Fluorinert™ liquids such as FC77, FC84 or other electronic thermal management fluid.

In various embodiments, system 100 does one or more of the following processes to the working fluid: degassing, dehydrating, PFIB filtering, moisture & gas filtering, particulate filtering, organic filtering, and/or particulate sensing. In some embodiments, system 100 conditions or treats a working fluid before the working fluid is added to the cooling system of the electronic system. In other embodiments, system 100 conditions, treats, and/or monitors the fluid after the fluid has been in the cooling system of an electronic system for a period of time. For instance, a working fluid may become contaminated after a period of use within an electrical system and it may need to be re-conditioned. Various embodiments omit one or more of the processes described above.

In some embodiments, system 100 can be used to separate different Fluorinerts that are accidentally mixed together. For instance, if a computer is being cooled with FC72 and a user added FC84 to the system, the mixture can be conditioned by system 100 and the system will separate the two types of fluid since they have different boiling points.

In one embodiment, conditioning system 100 includes a first processing section 140 and a second processing section 180. In one embodiment, these sections are coupled to a frame 101. FIG. 1 shows frame 101. However, FIGS. 2 and 3 omit the frame to better show details of system 100.

First processing section 140 is for de-gassing, dehydrating, and removing particulates from a working fluid, thus removing water and other foreign matter from the working fluid. Generally included within first processing section 140 is a working fluid storage section 120, a phase-change or condensing tank 141, and a cooling fluid section 160.

In one embodiment, storage section 120 includes a pair of working fluid storage members, a first storage tank or reservoir tank 121 and a second storage tank or reservoir tank 131. Some embodiments incorporate one reservoir tank or three or more reservoir tanks. In one embodiment, reservoir tank 121 and 131 are both 15 liter tanks. Other embodiments utilize other size tanks as needed.

First reservoir tank 121 includes a working fluid inlet port 123, a nozzle 124, and a heater element 125. First reservoir tank 121 also includes one or more ports connected to other parts of system 100 by one or more conduits 138. These connections will be discussed below as necessary. Inlet port 123 is for filling an untreated working fluid, such as FC72, into reservoir tank 121. In some embodiments, the working fluid is pumped into or out of reservoir tank 121 through nozzle 124. Alternatively, the working fluid can be pumped in through an input manifold 192. Input manifold 192 includes one or more input ports 193 which provide access to the system.

Heater element 125 is located on the bottom portion of reservoir tank 121. In some embodiments, heater element 125 is external to the reservoir tank. Heater element 125 is for heating the working fluid within first reservoir tank 121 until it is vaporized. In one embodiment, heater element 125 is one or more strip heating elements, such as Watlow strip heaters (manufactured by Watlow Electric Manufacturing Company of St. Louis, Mo.), which are bolted, clamped, or screwed to the bottom portion of tank 121.

In one embodiment, heater element 125 heats the working fluid up to approximately 56 degrees Celsius to approximately 62 degrees Celsius (for instance, when the working fluid is FC72). Other embodiments heat the working fluid up to different temperatures, depending on the boiling point of the working fluid. Thus, other types and sizes of heater elements can be utilized depending on the boiling point of the fluid being vaporized.

Second reservoir tank 131 includes a working fluid inlet port 133, a nozzle 134, and a heater element 135. Second reservoir tank 131 includes one or more ports connected to other parts of system 100 by one or more conduits 138. These connections will be discussed below as necessary. In some embodiments, inlet port 133 is for filling an untreated working fluid, such as FC72, into reservoir tank 131. In other embodiments, a working fluid is pumped into or out of reservoir tank 131 through nozzle 134. In some embodiments, inlet port 133 is omitted from second reservoir tank 131, and second reservoir tank 131 is used for storing treated fluid while first reservoir tank 121 is used for storing and boiling the untreated fluid. Nozzle 134 of reservoir tank 131 is used in one embodiment for removing the working fluid in a treated state from the conditioning system.

In one embodiment, heater element 135 is located on the bottom portion of reservoir tank 131. In some embodiments, heater element 135 is located externally to the reservoir tank. Heater element 135 is for boiling or vaporizing the working fluid within reservoir tank 131. In some embodiments, heater element 135 is omitted from second reservoir tank 131, and, as noted above, second reservoir tank 131 is used for storing treated fluid while first reservoir tank 121 is used for storing and boiling the untreated fluid. In the exemplary embodiment, heater element 135 is one or more strip heating elements, such as Watlow strip heaters (manufactured by Watlow Electric Manufacturing Company of St. Louis, Mo.), which are bolted, clamped, or screwed to the bottom portion of tank 131.

Tanks 121 and 131 are connected by one or more conduits 138 to condensing tank 141, to each other, and to second processing section 180. In one embodiment, a plurality of valves 139 are used throughout system 100 to control the flow of the working fluid through conduits 138. In one embodiment, each valve can be turned off or on depending on desired function of the system. For sake of clarity, the specific actions of each valve 139 will not be discussed unless needed for descriptive purposes. Those skilled in the art will recognize that different permutations of conduits 138 and valves 139 would allow different flows of a working fluid within the scope of the present invention.

In one embodiment, first reservoir tank 121 (or second tank 131) is connected to condensing tank 141, which is located above tank 121, so that when the working fluid is vaporized by heater element 125 (or element 135), the resulting vapor is directed by one or more conduits to condensing tank 141.

In one embodiment, condensing tank 141 includes a vent 142, one or more ports connected to other parts of system 100 by one or more conduits 138, and two cooling fluid inlet/outlet ports 144a–144b, which are connected to cooling fluid conduits 144 (see FIG. 3). In one embodiment, condensing tank 141 is a 10 liter tank for receiving vaporized working fluid from reservoir tank 121 or 131 and condensing the vaporized working fluid to a liquid state.

Within condensing tank 141, a cooling fluid flows through conduits 144 where the working fluid vapor contacts the conduits. A phase change of the working fluid occurs. The phase change from liquid to vapor, in tank 121, and back to liquid, in tank 141, removes gases, liquids, organic matter, particulates, and other foreign matter from the working fluid. Some of the foreign matter is vented out of the system through vent 142. In one embodiment, the treated working fluid is delivered to storage reservoir tank 131. In other embodiments, the working fluid is directly sent to second processing section 180. In one embodiment, to be described below, a second condensing tank is coupled to vent 142 to provide for even further condensing of working fluid remaining in the vapor which is vented through vent 142.

Cooling fluid section 160 is connected by conduits 144 to condensing tank 141 to provide the cooling fluid for causing the phase change within condensing tank 141.

In one embodiment, cooling fluid cycle section 160 includes a cooling coil 161, one or more fans 163, a storage tank 164, and a pump 165, coupled by conduits 144. Cooling coil 161 cools a cooling fluid, such as water, flowing through the closed-loop cycle between condensing tank 141 and cooling coil 161. The one or more fans 163 are located proximate cooling coil 161 for drawing air through or blowing air over cooling coil 161 to extract heat from the water flowing therein.

Storage tank 164 is used to store the cooling fluid, while pump 165 is connected inline to pump the cooling fluid through conduits 144 from storage tank 164 through cooling coils 161, into condensing tank 141, and back again. The exemplary cooling system provides a cooling water flowing through conduits 144 at approximately 25 degrees Celsius. Within tank 141 the cooling water increases to approximately 40–45 degrees Celsius when it comes in contact with the vaporized working fluid.

In one embodiment, cooling fluid cycle section 160 includes standard cooling coils and a condensing unit manufactured by Lytron (Woburn, MA).

In one embodiment, cooling fluid section 160 is omitted from system 100. In such an embodiment, the working fluid is air-cooled by one or more fans located within the condensing tank 141. The one or more fans blow or draw air across conduits carrying the working fluid, thus condensing the working fluid.

Conditioning system 100 also includes inlet manifold 192 and an outlet manifold 194. Input manifold 192 includes one or more inlet ports 193 and outlet manifold 194 includes one or more outlet ports 195. In some embodiments, a working fluid can be input into system 100 via one of inlets 194 (or, as noted above, it can be input through inlet port 123). The conditioned fluid is output through one of output ports 195. Conduits 138 running from the inlet and outlet ports combined with valves 139 permit many permutations of fluid flow. For instance, fluid can be added from an existing system into conditioning system 100 via input ports 193, it can be treated in section 140 and/or section 180 and then can be stored in one of tanks 121 or 131 or it can be output through outputs 195 of manifold 194.

Conditioning system 100 also includes second processing section 180 which includes a filtering section which can provide further processing to the working fluid.

In various embodiments, working fluid enters second processing section 180 by different ways. For instance, the working fluid can be delivered directly from first processing section 140, it can be delivered from first storage tank 121 or from second storage tank 131, or it can be directly inputted from outside the system (for instance, directly from an electronic system) through inlet manifold 192.

In one embodiment, second processing section 180 includes a particulate filter 182, a PFIB filter 184, a moisture/gas filter 186, a monitoring section 188, and a pump 190. Some embodiments omit one or more of the filters depending on particular needs of the working fluid being conditioned.

In one embodiment, pump 190 is a pump manufactured by Parker/Zenith having a variable capacity of up to 18 liters per minute. Other embodiments use other size pumps. Other embodiments use other pumps for pumping the working fluid through second processing section 180. Pump 190 is connected inline with the filters 182–186 and the monitoring section 188. Referring to FIG. 3, it can be seen that a conduit branch 191a lies between pump 190 and filter section 180. If valve 139 on conduit 191a is opened and the valve leading to filter section 180 is closed, the system can output working fluid without the fluid being filtered by section 180.

Particulate filter 182 is coupled to the pump. In one embodiment, particulate filter 182 is a polypropylene cartridge in a stainless steel housing. Particulate filter 182 filters particulates and organic matter present in the working fluid. The level of particulate filtering varies depending on use. In one embodiment, filter 182 is adapted to filter out 95% of particulates of 18 microns or greater. Those skilled in the art will recognize that other filters can be chosen which can provide different levels of filtering.

PFIB filter 184 is coupled to particulate filter 182. PFIB filter 184 filters or absorbs out of the working fluid any PFIBs or other organics present therein. In one embodiment, when Fluorinert is the working fluid, PFIB filter 184 is a proprietary filtering agent manufactured by 3M of St. Paul, Minn.

Moisture/gas filter 186 is coupled to PFIB filter 184. Moisture/gas filter 186 filters out gas, moisture, and/or particulates in the working fluid. In one embodiment, moisture/gas filter 186 is a Aeronex GateKeeper model 500K inert gas purifier (manufactured by Aeronex, San Diego, Calif.). In one embodiment, moisture/gas filter 186 removes $CO$, $CO_2$, $H_2$, $H_2O$, $O_2$ to a level of less than 1 ppb (parts per billion), and further removes particulates of greater than 12 microns.

In one embodiment, filters 182–186 are connected inline with one another. Thus, the working fluid flows through each filter 182-186 in order on its way through filter section 180. Some embodiments incorporate different arrangements of filters so that one or more filters are bypassed if necessary. The exemplary arrangement of filters 182–186 provides for a high level of filtering since each step provides a further refinement of the previous step. However, some embodiments utilize a different arrangement. For instance, the filters could be in the order of filter 186, filter 184, then filter 182. Moreover, other arrangements of filters are within the scope of the invention.

In one embodiment, monitoring section 188 includes a particulate sensor 196. An exemplary particulate sensor is an optical sensor for measuring the level of particulate in the working fluid. Other embodiments incorporate different or additional sensors depending on the fluid being conditioned. In one embodiment, articulate sensor 196 senses the amount of particulate or other foreign matter within the working fluid after it is filtered by filters 182–186.

In one embodiment, monitoring section 188 also includes a controller (not shown). If the sensor 196 senses that the working fluid is not properly conditioned, the controller can branch the working fluid back through filters 182–186 again. If sensor 196 senses that the working fluid is properly conditioned, the working fluid is then either directly pumped into the electronic system through outlet manifold 194 or it is pumped into reservoir tank 131 for storage until it is needed. In various embodiments, monitoring section 188 is used for sensing foreign matter such as particulates, gas, water, or other foreign matter.

In some embodiments, the controller can be a computer programmed to control the flow of the working fluid depending on the condition of the fluid. In other embodiments, the controller is a human who manually controls the flow depending on the condition of the fluid by monitoring a display, computer read-out, or other output. Second processing section 180 also includes a plurality of valves 139. One or more of the valves can be controlled by the controller. The controller can open and close one or valves 139 depending on the condition of the working fluid.

In one embodiment, system 100 also includes a vacuum pump 102 and a vacuum trap 103. Vacuum pump 102 is coupled by conduits to reservoir tanks 121 and 131 and to input manifold 192 and output manifold 194. Various valves control the function of vacuum pump 102. In one embodiment, vacuum pump 102 is for evacuating tank 121 or tank 131 before the working fluid is added to the tank. In another embodiment, vacuum pump 102 evacuates a module or chamber in the computer system that is being prepared to receive the working fluid. For instance, the computer system (or other heat generating system) can be hooked up to manifold 192 so that there is a direct connection between the module or chamber which is to receive the working fluid and the vacuum pump. Then the vacuum pump is activated and the chamber is evacuated. This provides a clean environment for introduction of the conditioned working fluid and thus provides for a longer life of the working fluid.

Exemplary Operation of the System

Figure 4:
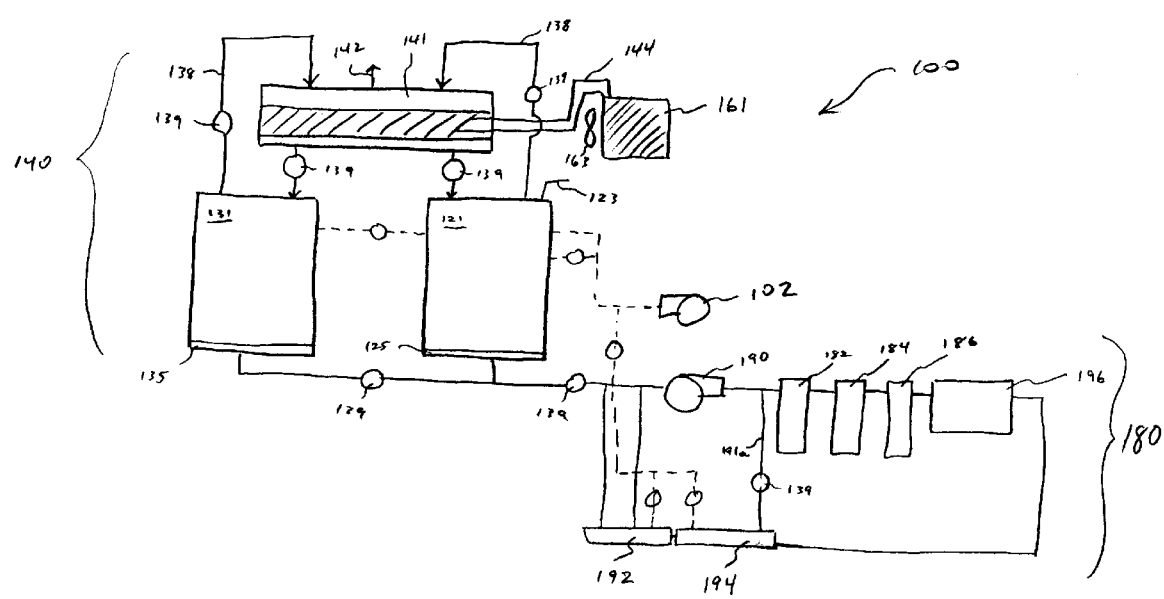
FIG. 4 is a schematic representation of the system of FIG. 1.

FIG. 4 is a schematic representation of system 100, which will be used to describe some exemplary operations of the system.

In one embodiment, an untreated working fluid is delivered to first processing section 140. The working fluid is put into reservoir tank 121 through inlet port 123. Heater element 125 heats the working fluid within tank 121. The resulting vapor is directed to condensing tank 141 where the vapor is exposed to conduit 144 carrying the cooling fluid water. The working fluid is condensed, contaminants are vented through vent 142, and the condensed working fluid is then delivered to tank 131 or is directly delivered to second processing section 180. In one process, the working fluid vapor has been de-gassed, dehydrated, and had particulates removed by the liquid to vapor and vapor to liquid phase changes.

In one exemplary operation, the working fluid is then directed to second processing section 180. Within second processing section 180 the working fluid is pumped by pump 190 through particulate filter 182, PFIB filter 184, and moisture/gas filter 186, respectively. Monitoring section 188 senses and monitors the condition of the fluid. In one embodiment, monitoring section 188 includes a particle sensor 196 for sensing the amount of particles still present in the working fluid after it has been through filter 182–186. Other embodiments incorporate different or additional sensors.

In the exemplary process, the working fluid is repeatedly filtered through filters 182–186 until the working fluid is properly conditioned and is suitable for long term use in a spray evaporative cooling system. The chamber which is to receive the conditioned fluid is evacuated by vacuum pump 102. Then the working fluid is output through one of the output ports in output manifold 194, or it is sent to tank 131 for further storage. Various embodiments incorporate different predetermined levels of purity. The specific level is decided by the end user of the working fluid.

In one exemplary embodiment, a perfluorinated liquid, such as Fluorinert™ electronic liquid (FC72), is the working fluid. An exemplary method of conditioning such a perfluorinated liquid for use in an evaporative spray cooling system includes heating the perfluorinated liquid to about 56 degrees Celsius, (in various embodiments, the perfluorinated liquid is heated to temperatures ranging from 56–62 degrees Celsius, depending on the pressure), condensing the perfluorinated liquid using water flowing at approximately 25 degrees Celsius, filtering the perfluorinated liquid through a PFIB filter, a gas/moisture filter, and a particulate filter, and monitoring a condition of the perfluorinated liquid. The perfluorinated liquid is then repeatedly filtered through the PFIB filter, the gas/moisture filter, and the particulate filter until the perfluorinated liquid reaches a predetermined condition. In one embodiment, the perfluorinated liquid is repeatedly filtered until the perfluorinated liquid has a moisture level of approximately less than 5 ppm (part per million) with a range of approximately less than 5 ppm to less than 8 ppm. The conditioned working fluid has a particulate level of approximately less than 20 ppm of particulates greater than 20 microns, this can range up to approximately less than 100 ppm of particulates of less than 20 microns. The conditioned working fluid has a gas level of approximately less than 5 ppb and in some embodiments the gas level ranges up to less than 2 ppm.

In another embodiment, the system conditions a used working fluid after it has been in an electrical or other heat producing system for some time. For instance, the used working fluid is pumped into reservoir tank 121 via input manifold 192, and then the process described above is done to the working fluid.

In another embodiment, the working fluid is pumped directly into second processing section 180 at inlet port 192, it is filtered and monitored by members 182–188 and then is directly pumped back into the electronic system.

In another embodiment, the working fluid is pumped into reservoir tank 121 and only the first processing section 140 process is done to the fluid (the filtering section process is omitted). In some embodiments, the working fluid is pumped into second processing section 180 at inlet manifold 192 and only the filtering process is done to the fluid (the first processing section 140 process is omitted).

Other embodiments incorporate various permutations of the above described processes for providing a desired condition of working fluid.

Figure 5:
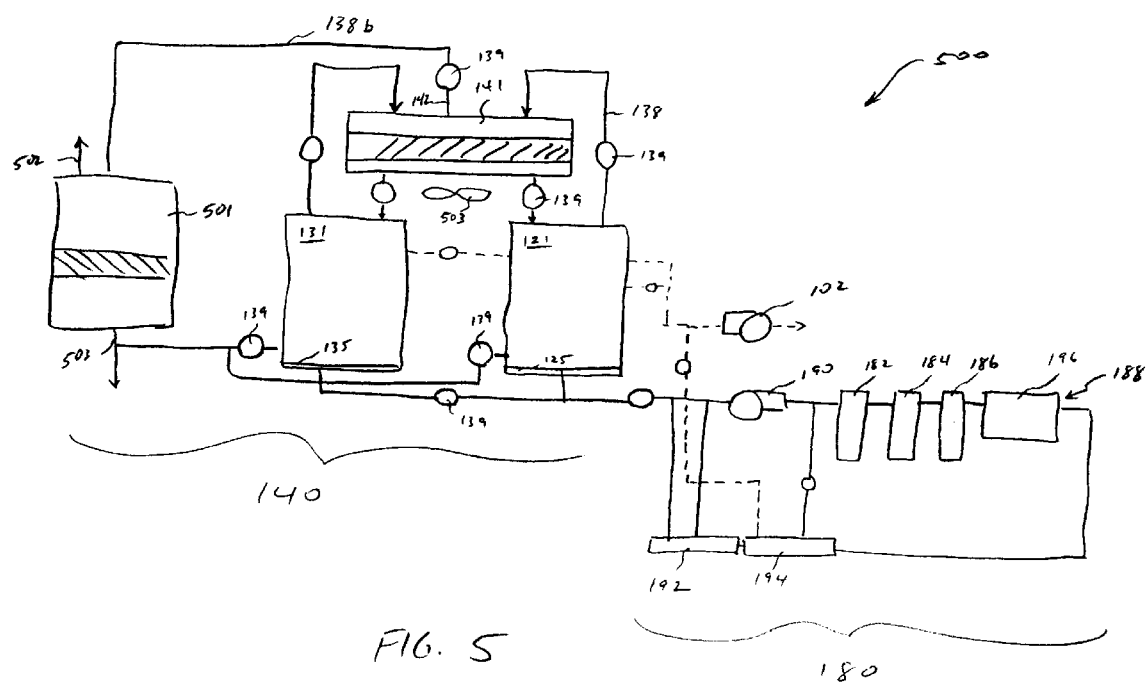
FIG. 5 is a schematic representation of an exemplary conditioning system according to another embodiment of the present invention.

FIG. 5 shows a representation of an exemplary conditioning system 500 according to another embodiment of the present invention. System 500 includes similar features to system 100 and like numbers are meant to represent like features.

System 500 includes a second condensing tank 501 coupled to the outlet of condensing tank 141 by a conduit 138b. Second condensing tank 501 provides for further refining and condensing of any working fluid which is in the vapor which escapes through outlet 142 of first condensing tank 141. In various embodiments, second condensing tank can include a water-cooling system (such as system 160 discussed above) or it can have a fan-cooled system. Second condensing tank 501 includes a vent 502 for venting to the atmosphere. An output 503 provides for conditioned working fluid to be sent to tanks 121 or 131.

System 500 also includes a fan 503. In this embodiment, a cooling fluid section such as cooling fluid section 160 is omitted. Instead, the vaporized working fluid is condensed in condensing tank 141 by using fan 503. Fan 503 either blows or draws cooling air over the cooling coils within tank 141 which carry the vaporized working fluid.

Those skilled in the art will recognize that the various features of exemplary systems 100 and 500 can combined within the scope of the present invention.

Conclusion

Spray evaporative cooling fluids which contain particulates, gases, organic material, and other foreign matter lower the efficiency of the cooling system. Inefficient cooling can lead to short life and unreliability of the electronic components. Accordingly, the present inventors have devised methods and systems for conditioning the working fluid of a spray evaporative cooling system. An exemplary conditioning system includes a first processing section for degassing and dehydrating a working fluid, a second processing section for filtering the working fluid, and a monitoring section for sensing a condition of the working fluid, wherein a flow of the working fluid depends on the condition of the working fluid.

It is understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A fluid conditioning system comprising:
    a first processing section for degassing and dehydrating a working fluid, wherein the first processing section includes a condensing tank for condensing the working fluid from a vaporized state to a liquid state;
    a second processing section for filtering the working fluid; and
    a monitoring section for sensing a condition of the working fluid, wherein a flow of the working fluid depends on the condition of the working fluid as sensed by the monitoring section.

2. The fluid conditioning system of claim 1, wherein the condensing tank has a cooling fluid flowing through a conduit located within the condensing tank, wherein the working fluid in the vaporized state is condensed by contact with the conduit.

3. The fluid conditioning system of claim 2, further comprising a cooling coil connected to the condensing tank for cooling the cooling fluid;
    a fan proximate the cooling coil for drawing air across the cooling coil; and
    a first pump connected to the cooling coil and the condensing tank for pumping the cooling fluid through the cooling coil and the condensing tank.

4. A fluid conditioning system comprising:
    a first processing section for degassing and dehydrating a working fluid;
    a second processing section for filtering the working fluid, the second processing section including at least three filters connected inline with one another and a pump connected inline with the at least three filters, wherein the at least three filters include a particulate filter, a PFIB filter, and a moisture and gas filter; and
    a monitoring section for sensing a condition of the working fluid, wherein a flow of the working fluid depends on the condition of the working fluid as sensed by the monitoring section.

5. A fluid conditioning system comprising:
    a first processing section for degassing and dehydrating a working fluid;
    a second processing section for filtering the working fluid, the second processing section including at least three filters connected inline with one another and a pump connected inline with the at least three filters, wherein the at least three filters include a particulate filter, a PFIB filter, and a moisture and gas filter; and
    a monitoring section for sensing a condition of the working fluid, wherein a flow of the working fluid depends on the condition of the working fluid as sensed by the monitoring section; wherein the particulate filter, the PFIB filter, and the moisture and gas filter are connected in an order wherein the particulate filter is first, the PFIB filter is second, and the moisture and gas filter is third.

6. A fluid conditioning system comprising:
    a first processing section for degassing and dehydrating a working fluid;
    a second processing section for filtering the working fluid; and
    a monitoring section for sensing a condition of the working fluid, wherein a flow of the working fluid depends on the condition of the working fluid as sensed by the monitoring section, wherein the monitoring section includes a particulate counter for sensing any particulates in the working fluid, and wherein the conditioning system includes one or more valves and wherein an opening and a closing of the one or more valves depends on the condition of the working fluid.

7. A conditioning system for conditioning a working fluid of a spray evaporative cooling system, the conditioning system comprising:
    an inlet port for inputting the working fluid in an untreated state into the conditioning system;
    one or more processing sections for conditioning the working fluid, wherein the one or more processing sections process the working fluid into a predetermined treated state suitable for spray evaporative cooling, wherein one of the one or more processing sections comprises a filtering section comprising:
        a pump;
        at least three filters connected inline with the pump, wherein the at least three filters includes a particulate filter, a PFIB filter, and a moisture and gas filter;
        a monitoring section connected inline with the one or more filters; and
        one or more valves connected to the monitoring section, wherein the monitoring section controls opening and closing of the one or more valves; and
    an outlet port for removing the working fluid in the predetermined treated state from the conditioning system.

8. The conditioning system of claim 7, wherein the PFIB filter, the moisture and gas filter, and the particulate filter are connected in an order wherein the particulate filter is first, the PFIB filter is second, and the moisture and gas filter is third.

9. A conditioning system for conditioning a working fluid of a spray evaporative cooling system, the conditioning system comprising:
    an inlet port for inputting the working fluid in an untreated state into the conditioning system;
    one or more processing sections for conditioning the working fluid, wherein the one or more processing sections process the working fluid into a predetermined treated state suitable for spray evaporative, wherein one of the one or more processing sections comprises a filtering section comprising:
        a pump;
        one or more filters connected inline with the pump;
        a monitoring section connected inline with the one or more filters; and
        one or more valves connected to the monitoring section, wherein the monitoring section controls opening and closing of the one or more valves cooling; and an outlet port for removing the working fluid in the predetermined treated state from the conditioning system;

wherein the monitoring section includes a sensor for sensing any foreign matter in the working fluid after the working fluid has been filtered; and a valve for directing the flow of the working fluid between the outlet port and the filter section, wherein if the sensor senses a predetermined amount of foreign matter in the working fluid, the valve directs the flow of working fluid through the filter section and if the sensor does not sense a predetermined amount of foreign matter in the working fluid, the valve directs the flow of the working fluid to the outlet port.

10. A system for treating a working fluid for a spray evaporative cooling system, the system comprising:

a first storage tank for holding the working fluid in an untreated state;

a second storage tank;

a heater coupled to the first storage tank for heating the untreated working fluid to a vaporized state;

a condensing tank connected to the first tank for receiving the working fluid in the vaporized state from the first tank and for condensing the working fluid from the vaporized state to a liquid state, the condensing tank connected to the second tank for delivering the condensed working fluid to the second tank, the condensing tank having a cooling fluid flowing through a conduit located within the condensing tank, wherein the working fluid in the vaporized state is condensed by contact with the conduit;

a cooling fluid section connected to the condensing tank, wherein the cooling fluid section comprises:
  a cooling coil connected to the condensing tank;
  a fan proximate the cooling coil for drawing air across the cooling coil; and
  a first pump connected to the cooling coil and the condensing tank for pumping the cooling fluid through the cooling coil and the condensing tank;

a filter section connected to the second tank for receiving the working fluid from the second tank, the filter section including a PFIB filter, a moisture and gas filter, and a particle filter;

a second pump for pumping the working fluid through the filter section;

a particulate sensor connected with the filter section for sensing any particulates in the working fluid after the working fluid has been filtered;

a valve for directing the flow of the working fluid between an outlet port and the filter section, wherein if the particle counter senses a predetermined amount of particles in the working fluid the valve directs the flow of working fluid through the filter section and if the particle counter does not sense a predetermined amount of particles in the working fluid, the valve directs the flow of the working fluid to the outlet port; and a vacuum pump for evacuating a chamber which is connected to the outlet port.

11. The system of claim 10, wherein the condensing tank includes a vent for venting a gas released from the working fluid.

12. The system of claim 10, wherein the cooling fluid section further comprises a cooling fluid storage tank connected inline with the cooling coil and the condenser tank for storing the cooling fluid.

13. The system of claim 10, wherein the second tank includes an outlet port for delivering the working fluid to a heat producing system.

14. A method of conditioning a perfluorinated liquid before the perfluorinated liquid is used for spray evaporative cooling, the method comprising:

heating the perfluorinated liquid to a vaporized state;

condensing the vaporized perfluorinated liquid;

filtering the perfluorinated liquid through a particulate filter;

filtering the perfluorinated liquid through a PFIB filter;

filtering the perfluorinated liquid through a gas/moisture filter;

monitoring a condition of the perfluorinated liquid; and repeatedly filtering the perfluorinated liquid through the PFIB filter, the gas/moisture filter, and the particulate filter until the perfluorinated liquid reaches a predetermined condition.

15. The method of claim 14, wherein heating comprises heating the perfluorinated liquid to a temperature above approximately 56 degrees Celsius.

16. The method of claim 14, wherein repeatedly filtering comprises repeatedly filtering the perfluorinated liquid unto the perfluorinated liquid has a particulate level of approximately less than 20 ppm of particulates greater than 20 microns.

* * * * *

UNITED STATES PATENT AND TRADEMARK OFFICE
CERTIFICATE OF CORRECTION

PATENT NO. : 6,345,515 B1
DATED : February 12, 2002
INVENTOR(S) : Pautsch et al.

It is certified that error appears in the above-identified patent and that said Letters Patent is hereby corrected as shown below:

Column 1,
Line 11, delete "Modem" and insert -- Modern --, therefor.
Line 15, delete "modem" and insert -- modern --, therefor.

Signed and Sealed this

Twenty-third Day of April, 2002

Attest:

Attesting Officer

JAMES E. ROGAN
Director of the United States Patent and Trademark Office